United States Patent
Joo et al.

(10) Patent No.: US 6,340,600 B1
(45) Date of Patent: Jan. 22, 2002

(54) METHODS FOR FABRICATING LARGE SINGLE-GRAINED FERROELECTRIC THIN FILM, FOR FABRICATING FERROELECTRIC THIN FILM CAPACITOR USING THE SAME, AND FOR FABRICATING FERROELECTRIC MEMORY DEVICE USING THE SAME

(75) Inventors: Seung Ki Joo, Seoul; Jang Sik Lee, Pusan, both of (KR)

(73) Assignee: Seung Kee Joo, Seoul (KR)

( * ) Notice: Subject to any disclaimer, the term of this patent is extended or adjusted under 35 U.S.C. 154(b) by 0 days.

(21) Appl. No.: 09/837,268

(22) Filed: Apr. 19, 2001

(30) Foreign Application Priority Data

Mar. 6, 2001 (KR) .......................................... 2001-11457

(51) Int. Cl.[7] .............................................. H01L 21/00
(52) U.S. Cl. ........................................... 438/3; 438/933
(58) Field of Search ...................... 438/3, 933; 257/295, 257/310, 315, 316, 410, 233, 421

(56) References Cited

U.S. PATENT DOCUMENTS

| | | | | |
|---|---|---|---|---|
| 5,168,420 A | * | 12/1992 | Ramesh et al. ................. 505/1 |
| 5,418,389 A | * | 5/1995 | Watanabe .................... 257/295 |
| 5,739,563 A | * | 4/1998 | Kawakubo et al. ......... 257/295 |
| 5,909,389 A | * | 6/1999 | Kawakubo et al. ......... 365/145 |
| 5,962,884 A | * | 10/1999 | Hsu et al. .................... 257/295 |
| 5,998,819 A | * | 12/1999 | Yokoyama et al. .......... 257/295 |
| 6,190,925 B1 | * | 2/2001 | Li et al. ......................... 438/3 |
| 6,225,655 B1 | * | 5/2001 | Moise et al. ................. 257/295 |
| 6,242,771 B1 | * | 6/2001 | Hsu et al. .................... 257/295 |
| 2001/0015488 | * | 8/2001 | Kawakubo et al. ......... 257/296 |

* cited by examiner

Primary Examiner—Michael S. Lebentritt
(74) Attorney, Agent, or Firm—Rosenberg, Klein & Lee

(57) ABSTRACT

A method for fabricating a large single-grained ferroelectric thin film grown by selectively nucleated lateral crystallization (SNLC) using an artificial nucleation seed, a method for fabricating a ferroelectric capacitor using the same, and a method for fabricating a ferroelectric memory device using the same. The ferroelectric thin film fabrication method includes the steps of forming a first conductive layer on one side of a semiconductor substrate, by using a conductive material, forming an artificial nucleation seed in an island form adjacent a position where a ferroelectric thin film is to be formed in the upper portion of the first conductive layer, forming a ferroelectric thin film on the whole surface of the substrate including the nucleation seed, and thermally annealing the ferroelectric thin film to thereby grow the ferroelectric thin film positioned in the lateral side of the nucleation seed into a single-grained ferroelectric thin film.

19 Claims, 11 Drawing Sheets

(● Perovskite, ▼ Pyrochlore)

( ● Perovskite ▼ Pyrochlore )

PZT seed

PZT seed

Grain boundary

100μm

METHODS FOR FABRICATING LARGE SINGLE-GRAINED FERROELECTRIC THIN FILM, FOR FABRICATING FERROELECTRIC THIN FILM CAPACITOR USING THE SAME, AND FOR FABRICATING FERROELECTRIC MEMORY DEVICE USING THE SAME

BACKGROUND OF THE INVENTION

1. Field of the Invention

The present invention relates to a method for fabricating a large single-grained ferroelectric thin film, and more particularly, to methods for fabricating a large single-grained ferroelectric thin film grown by selectively nucleated lateral crystallization (SNLC) using an artificial nucleation seed, for fabricating a ferroelectric capacitor using the single-grained ferroelectric thin film, and for fabricating a ferroelectric memory device using the ferroelectric capacitor.

2. Description of the Related Art

In general, a Perovskite ferroelectric material including PZT ($PbZr_xTi_{1-x}O_3$) possesses excellent piezoelectric, super-conductive and ferroelectric properties. Thus, PZT is widely used for various elements.

Recently, PZT applications are vividly under study as in a FRAM (Ferroelectric Random Access Memory) for storing information by using polarization of PZT deposited in the form of a thin film by means of sputtering, CVD (Chemical Vapor Deposition), sol-gel and so on, and a DRAM (Dynamic Random Access Memory) using a high dielectric constant.

In the case of a semiconductor memory device, as shown in FIGS. 1A and 1B, a basic structure of a single memory cell has an integrated form of a single transistor TR and a single capacitor C, in which the transistor and the capacitor in the memory cell are electrically connected with each other.

Also, the capacitor C has an upper electrode C1 and a lower electrode C2 on the upper portion and the lower portion of a dielectric D, respectively. The lower electrode C1 is connected with the transistor TR via a plug P. The gate and source of the transistor TR positioned on the lower side in a substrate S are connected to a word line and a bit line, respectively, to thereby play a role of controlling the operation of the capacitor C.

However, a conventional information memory device uses a ferroelectric thin film made of a polycrystalline PZT as a dielectric D of the capacitor C. Here, since such a polycrystalline structured ferroelectric thin film has a columnar structure, grain boundaries arranged perpendicular to the electrode function as a diffusion path of oxygen vacancy, resulting in a more accelerated degradation phenomenon, such as fatigue, retention, low breakdown field, etc.

Also, in the case of the conventional information memory device, applications of PZT have been limited owing to a fatigue phenomenon that lowers polarization whenever a process of storing and reading information is repeated, an aging phenomenon that lowers properties as time passes, and phenomena such as a low breakage electric field and a large leakage current.

Attempts to reduce fatigue have been currently made using an oxide electrode such as a $RuO_2$ electrode instead of a Pt electrode as an upper/lower electrode in a ferroelectric thin film capacitor, in which case a leakage current relatively has increased.

Inventors have found that properties of a thin film can be enhanced since a degeneration expediting factor can be removed in the case that grain boundaries are excluded by selective nucleation and lateral growth in the result of studying properties of the conventional ferroelectric thin film.

Thus, the present invention provides a method applied to a capacitor in an actual semiconductor memory device in which the positions of the grain boundaries are adjusted to form a single-grained crystalline at a selected position in order to solve a property degeneration problem due to the grain boundaries.

SUMMARY OF THE INVENTION

To solve the above problems, it is an object of the present invention to provide a method for fabricating a single-grained ferroelectric thin film capable of growing a large single-grained ferroelectric thin film having an excellent thin film characteristic by selectively nucleated lateral crystallization (SNLC) using an artificial nucleation seed.

It is another object of the present invention to provide a method for fabricating a ferroelectric memory device using a ferroelectric thin film capacitor fabricated by forming an artificial nucleation seed at a position adjacent a plug for connecting a transistor and a capacitor, and growing a large single-grained ferroelectric thin film by selectively nucleated lateral crystallization (SNLC) using the artificial nucleation seed, in which excellent polarization is maintained even after undergoing a number of cycles, and a little amount of leakage current occurs, and a crystallization is possible at a low temperature to thereby maintain an excellent dielectric feature and lower an aging phenomenon such as a fatigue.

It is still another object of the present invention to provide a method for fabricating a ferroelectric thin film capacitor for use in a ferroelectric memory device in which the thickness of a growing single-grained ferroelectric thin film is grown in an ultra-thin film so as to be driven at a low operating voltage.

To accomplish the above object of the present invention, there is provided a method for fabricating a single-grained ferroelectric thin film comprising the steps of: forming a first conductive layer on one side of a semiconductor substrate, by using a conductive material; forming an artificial nucleation seed in an island form adjacent a position where a ferroelectric thin film is to be formed in the upper portion of the first conductive layer; forming a ferroelectric thin film on the whole surface of the substrate including the nucleation seed; and thermally annealing the ferroelectric thin film to thereby grow the ferroelectric thin film positioned in the lateral side of the nucleation seed into a single-grained ferroelectric thin film.

There is also provided a method for fabricating a ferroelectric memory device such as a ferroelectric random access memory (FRAM) using a ferroelectric thin film capacitor comprising the steps of: forming a transistor on one side of a semiconductor substrate; forming an insulation layer on the upper portion of the transistor; forming a plug for connecting the transistor and the capacitor via the insulation layer; forming a first electrode layer used as a first electrode of the capacitor on the upper portion of the insulation layer and the plug; forming an artificial nucleation seed at a position adjacent the plug on the upper portion of the first electrode; forming a ferroelectric thin film on the whole surface of the substrate including the nucleation seed; thermally annealing the ferroelectric thin film to thereby grow the ferroelectric thin film positioned in the lateral side of the nucleation seed into a single-grained ferroelectric thin film; and forming a second electrode layer used as a second electrode on the upper portion of the single-grained ferroelectric thin film.

Here, a p-type or n-type silicon substrate is used as the semiconductor substrate. The material used as the artificial nucleation seed is made of a ferroelectric thin film.

The ferroelectric thin film is not particularly limited but is made of a ferroelectric material of $ABO_3$ perovskite composite, in which A is made of at least one selected from the group consisting of lead (Pb), barium (Ba), and strontium (Sr), and B is made of at least one selected from the group consisting of zirconium (Zr), titanium (Ti), lanthanum (La) and tungsten (W).

Also, the ferroelectric thin film is made of a ferroelectric material of Bi-layered super-lattices, such as, $Bi_{4-x}La_xTi_3O_{12}$ (x=0~4), or $A'Bi_bM_cO_{(2+3b+5c)/2}$ type composite including Bi, in which A' is made of at least one selected from the group consisting of barium (Ba), strontium (Sr), and lead (Pb) and M is made of at least one selected from the group consisting of titanium (Ti), tantalum (Ta), and niobium (Nb).

The ferroelectric thin film can be deposited by one of sol-gel, sputtering and metal-organic CVD methods, and the crystallization of the ferroelectric thin film can be accomplished by a thermal annealing at 300~800° C.

In this case, the crystallization thermal annealing can be accomplished by using one of a tubular furnace, a rapid thermal annealing (RTA) apparatus, and a scanning type rapid thermal annealing apparatus.

Also, the crystallization of the ferroelectric thin film proceeds laterally at the upper portion of the nucleation seed, and the size of the grain of the laterally grown single-grain thin film sets a thermal annealing time by a length necessary for the capacitor in the memory device.

Preferably, the electrode layer is made of at least one selected from the group consisting of platinum (Pt), iridium (Ir), iridium oxide ($IrO_2$), ruthenium (Ru) and ruthenium oxide ($RuO_2$), the plug is made of metal or a silicon-containing material and the insulation layer is made of a silicon-containing oxide or a polymer group material.

As described above, the present invention applies a new selectively nucleated lateral crystallization (SNLC) technique to fabrication of a ferroelectric memory device to prevent grain boundaries from being positioned in the fabricated memory device, in which the nucleation seed are artificially formed in the lateral side of the plug and then the ferroelectric thin film formed on the upper portion of the nucleation seed is laterally crystallized into a large single-grained ferroelectric thin film.

As a result, the present invention can fabricate a ferroelectric thin film capacitor and a ferroelectric memory device using the same, using a single-grained ferroelectric thin film, in which excellent polarization is maintained even after undergoing a number of cycles, and a little amount of leakage current occurs, and a crystallization is possible at a low temperature to thereby maintain an excellent dielectric feature and lower an aging phenomenon such as a fatigue.

BRIEF DESCRIPTION OF THE DRAWINGS

The objects and other advantages of the present venation will become more apparent by describing in detail the structures and operations of the present invention with reference to the accompanying drawings, in which.

DETAILED DESCRIPTION OF THE EMBODIMENTS

Figure 1A:
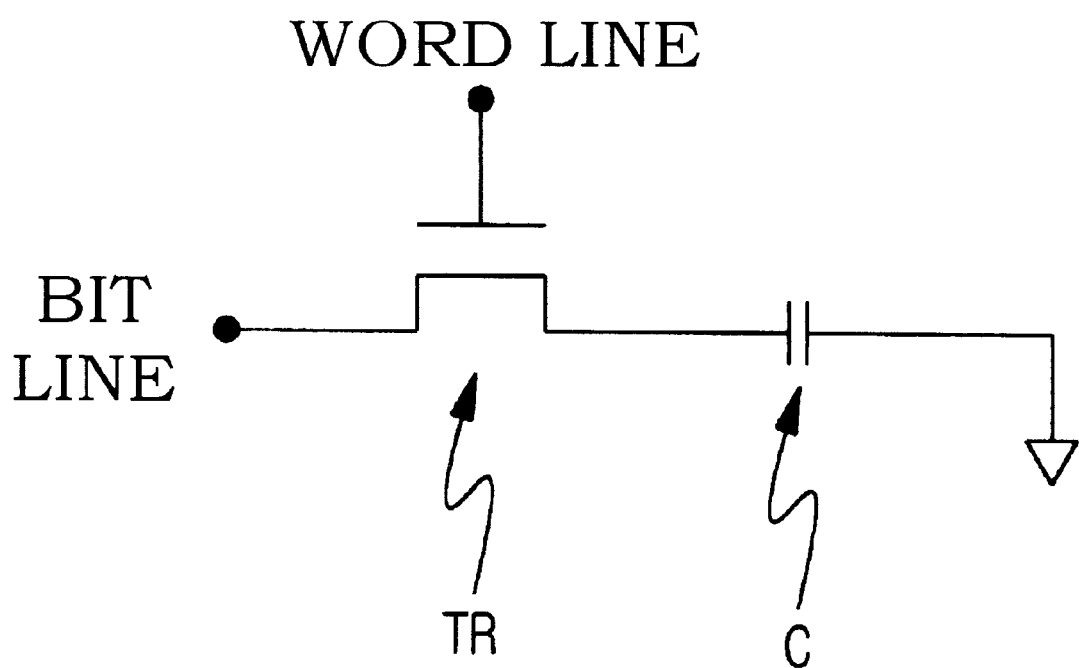
FIG. 1A is a schematic circuitry diagram showing a single memory device of FRAM (Ferroelectric Random Access Memory)
Figure 1B:
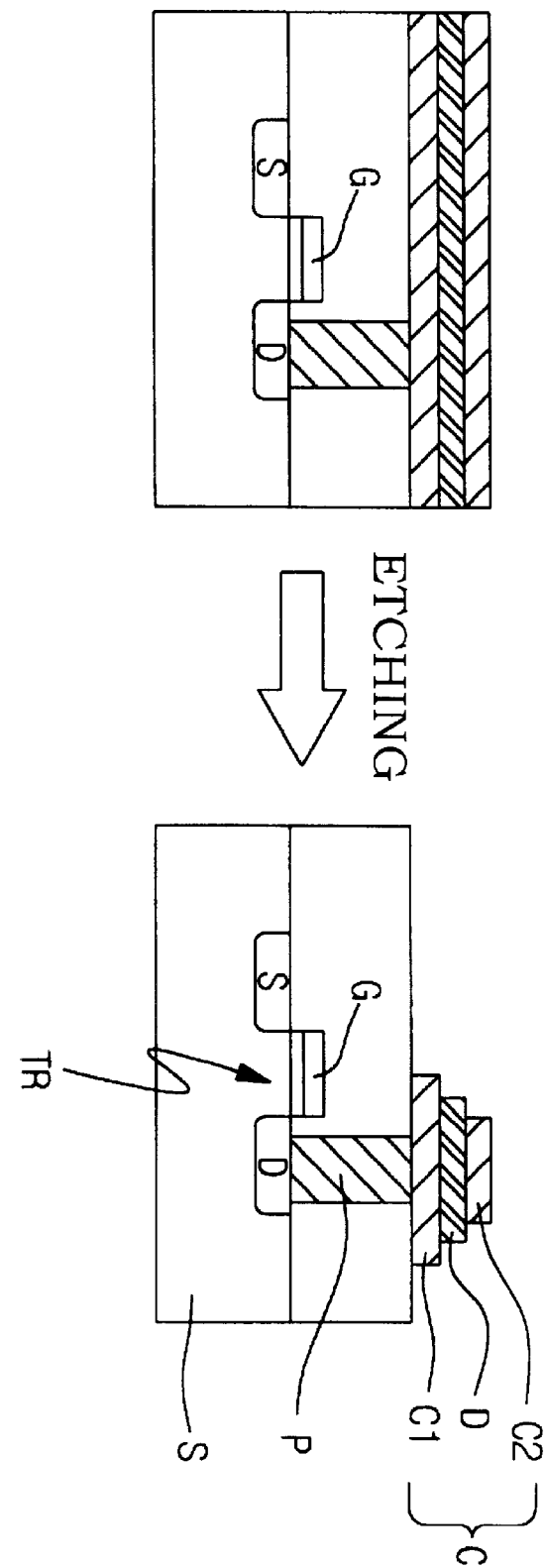
FIG. 1B is an exemplary sectional view showing a capacitor fabrication process in fabricating the ferroelectric memory device shown in FIG. 1A.

A preferred embodiment of the present invention will be described in detail with reference to the accompanying drawings.

Hereinbelow, a ferroelectric thin film specimen fabricated in order to explain crystallization phases of a PZT thin film according to the conventional art and the present invention and a method for measuring the properties will be described.

A specimen has been formed by depositing platinum and PZT thin film on a silicon substrate 1 using a 3-gun magnetron sputtering apparatus. A specimen holder has been located at the center of a concentric circle made of the center of each gun in order to minimize an ion collision effect, and made to be heated up to at maximum 500° C. using a contact heating-type heater. Also, using a rotary pump and an diffusion pump, an initial vacuum of at maximum $1 \times 10^{-6}$ torr has been obtained. The specimen holder has been rotated in order to deposit a uniform thin film.

In the case of a substrate according to the present invention, a p-type Si wafer is thermally oxidized to then form a $SiO_2$ film of 5000 Å as an insulation film 2 thereon. Thereafter, the substrate has been washed for ten minutes in a 1:1 solution of $H_2SO_4$ and $H_2O_2$, and for ten seconds in a buffered HF solution.

In the case of deposition of a platinum thin film used as a lower electrode 3, platinum is deposited in a DC sputtering method using pure argon gas. During deposition, the substrate has been maintained at 350° C. The initial vacuum has been made at $5 \times 10^{-6}$ torr or less. During deposition, a processing pressure has been maintained at 20 mtorr using a flow controller and a conduction valve.

In the case of deposition of a PZT thin film 4, a metal target of Pb, Zr or Ti has been used for deposition with a reactive sputtering method using oxygen and argon.

A ratio of oxygen and argon has been made 1:9 using a flow controller. During deposition, a processing pressure has been maintained at 20 mtorr. Here, pre-sputtering of each specimen has been performed for twenty minutes using pure argon and for ten minutes or more using a mixture gas of oxygen and argon, to thereby saturate surface oxidation of the target at the time of the reactive sputtering to then maintain a deposition velocity to be constant.

The deposition condition of the PZT thin film 4 is illustrated in the following Table 1.

TABLE 1

| specimen | | Pt(2000Å)/SiO$_2$(5000Å)/Si |
|---|---|---|
| Specimen temperature | | 350° C. |
| gas pressure | | Ar(1 sccm) + O$_2$ (9 sccm) |
| pressure | | 20 mtorr |
| power | Pb | RF 30W |
| | Zr | RF 80W |
| | Ti | RF 320W |

A post-thermal annealing of the PZT thin film 4 has been performed, in which case temperature has been changed in the range of 500–600° C. at the atmosphere and oxygen atmosphere, using a rapid thermal annealing apparatus using a halogen lamp, and a tubular furnace. In order to adjust temperature accurately, temperature has been compensated for by making a standard test piece having the same structure as that of the test piece contact a thermocouple.

The composition of the PZT thin film has been identified by an EDS (Energy Dispersive Spectroscopy) and an AES (Auger Electron Spectroscopy), and the micro-structure of the PZT thin film has been measured by an OM (Optical Microscopy) and a SEM (Scanning Electron Microscopy).

A phase formation has been observed using an X-ray diffractometer (XRD). In order to measure an electrical characteristic, a platinum upper electrode has been formed using a lift-off method and a shadow mask.

Figure 2A:
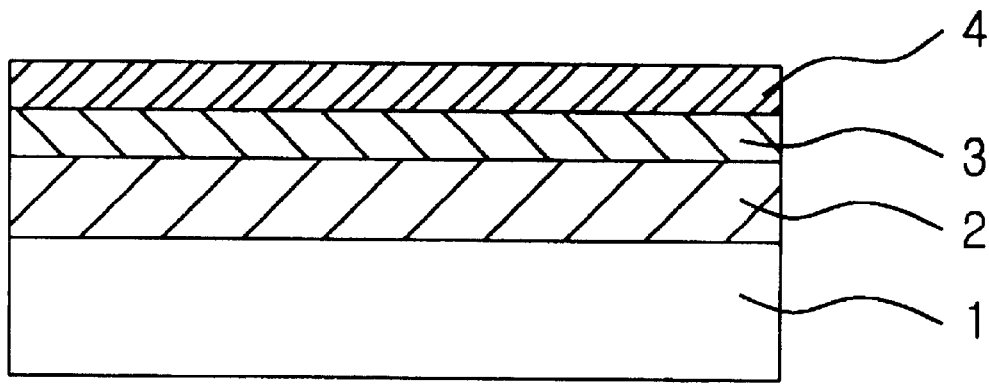
FIG. 2A is a cross-sectional view showing a specimen fabricated in order to explain crystallization phases of a PZT thin film formed without using a PZT seed according to conventional art.

FIG. 2A is a cross-sectional view showing a conventional ferroelectric thin film specimen fabricated in order to explain crystallization phases depending upon thermal annealing temperature of a PZT thin film formed without using a PZT seed according to the conventional art. The thermal annealing atmosphere has been in the air and the thermal annealing time has been fixed to thirty minutes.

Figure 2B:
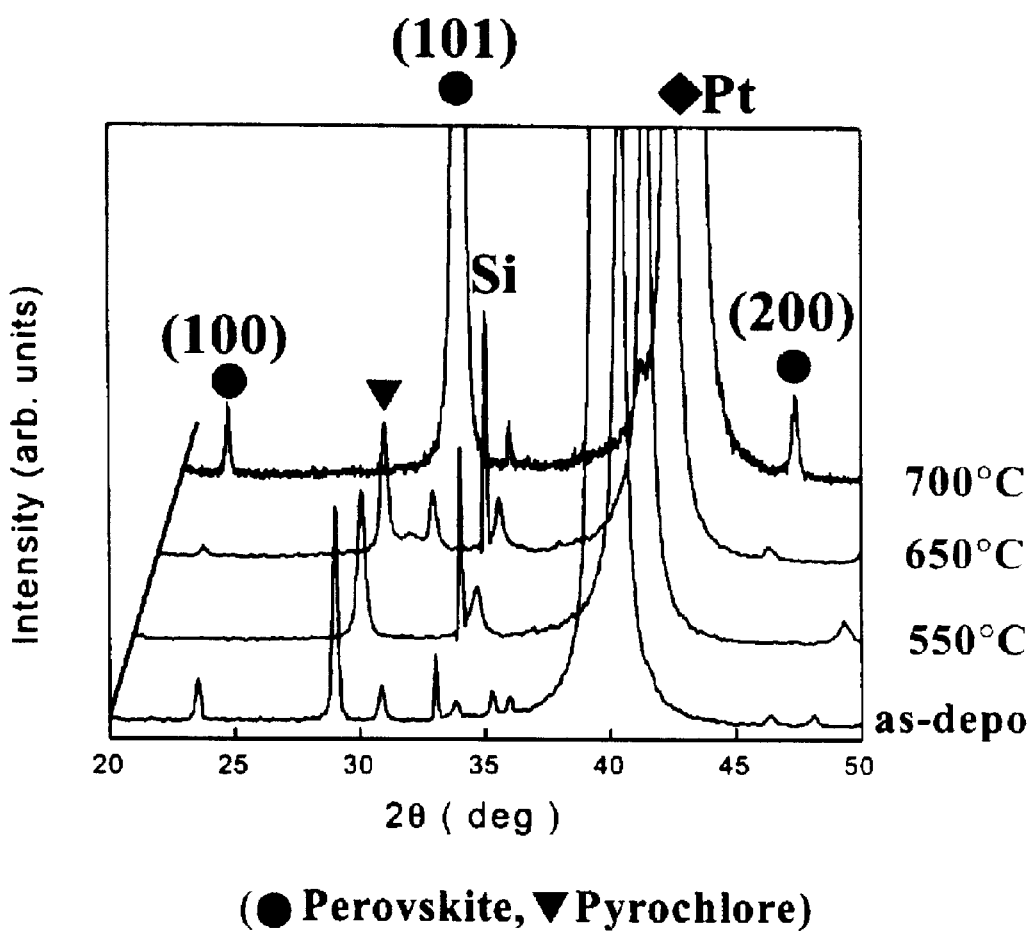
FIG. 2B is an X-ray diffraction pattern illustrating crystallization phases of the specimen of FIG. 2A.

In the PZT thin film 4 formed by the sputtering, a Pyrochlore phase has been a main phase up to 550° C. as shown in FIG. 2B. However the Perovskite phases of (101), (100) and (200) have been formed by the thermal annealing at 650° C., the main phase has been still the Pyrochlore phase. It can be seen that all the Pyrochlore phases have disappeared at the thermal annealing temperature of 700° C. or so and have been completely changed into the Perovskite phases, in which case the main peak has been the (101) phase.

Figure 3A:
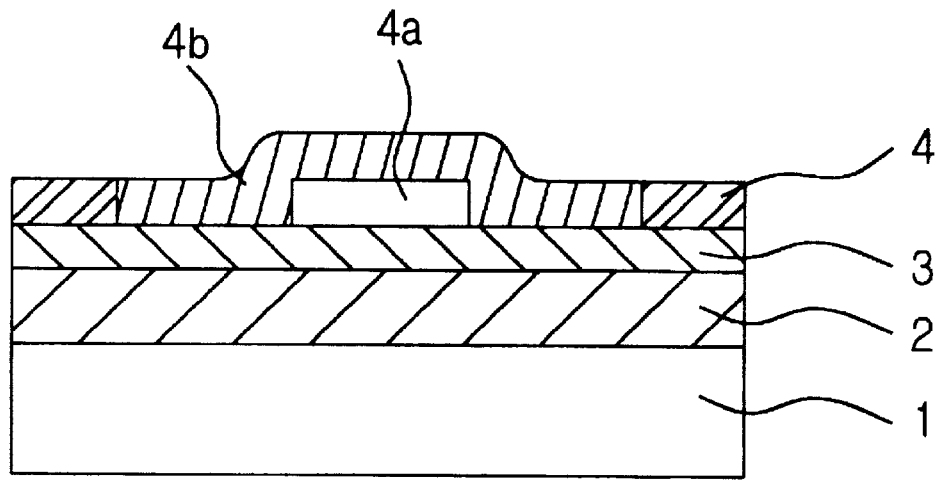
FIG. 3A is a cross-sectional view showing a specimen fabricated in order to explain crystallization phases of a PZT thin film formed by selectively nucleated lateral crystallization (SNLC) using a PZT seed according to the present invention.

Meanwhile, FIG. 3A is a cross-sectional view showing a specimen of a ferroelectric thin film fabricated in order to explain crystallization phases of a PZT thin film using a PZT seed for selectively nucleated lateral crystallization (SNLC) according to an embodiment of the present invention. In this case, the PZT thin film 4 of the Pyrochlore phase has been formed again on the PZT seed 4a of 100 nm-thick which has been changed into the Perovskite phase and then has played a role of the nucleation seed. Then, a phase change has been measured depending upon the thermal annealing temperature.

Figure 3B:
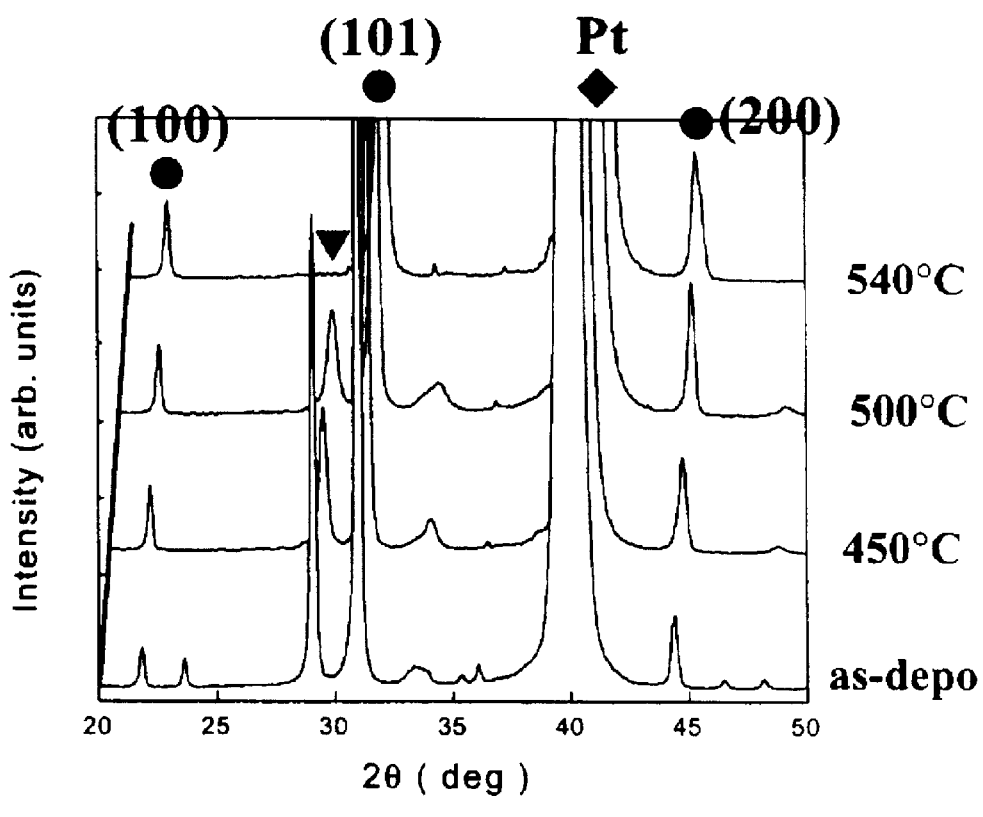
FIG. 3B is an X-ray diffraction graph illustrating crystallization phases of the specimen of FIG. 3A.

FIG. 3B is a graph showing a phase change through a post-thermal annealing process after the PZT thin film 4 has been formed by sputtering at 350° C. on a PZT seed 4a, that is, a PZT thin film which has been changed into the Perovskite structure by performing a RTA (rapid thermal annealing) process for thirty minutes at 700° C. As such, when the PZT thin film has been formed on the PZT seed 4a, it can be seen that the Perovskite phase and the Pyrochlore phase have coexisted in the specimen of the present invention, differently from the result of the conventional case which has formed the PZT thin film on the platinum (Pt) layer. This reveals that the PZT thin film 4 has been crystallized into the Perovskite phase to a degree by the PZT seed 4a of the Perovskite structure formed on the lower portion of the PZT thin film 4, at the same time when the PZT thin film 4 has been being deposited.

However, considering that the penetration depth of the X-ray is several $\mu$m at the XRD analysis and the lower portion of the PZT thin film 4 is the PZT seed 4a being the Perovskite structure of 100 nm thick, it seems that the main phase of the PZT thin film 4 formed on the upper portion of the specimen is the Pyrochlore phase.

It can be seen that the Pyrochlore phase starts to decrease remarkably even by the thermal annealing at a low temperature of 450° C. or so and the upper PZT thin film 4 has been crystallized into the Perovskite phase after having performed the thermal annealing at 540° C. or so. In FIG. 3A, a reference numeral 4b denotes a single-grained PZT thin film which has been changed into the Perovskite structure.

Comparing the results of the present invention with those of the conventional example, it can be seen that the transition temperature at which the upper PZT thin film 4 of the Pyrochlore phase has been changed into that of the Perovskite phase has decreased by 150° C. or more by the lower PZT seed 4a of the Perovskite phase in the present invention embodiment specimen.

From the above result, the crystallized PZT seed 4a is partially formed in the form of an island. When the PZT thin film 4 is formed again on the PZT seed 4a and the lower electrode 3 and then thermally annealed between 540° C. and 700° C., the upper portion of the previously formed island patterned PZT seed 4a is crystallized and then from the upper portion of the island patterned PZT seed 4a proceeds with lateral crystallization. However, it is expected that crystallization does not occurred at the portion having no PZT seed 4a because of the temperature at which a nucleus is not produced, and thus only the lateral growth proceeds from the PZT seed 4a, whose results are shown in FIGS. 4A and 4B.

Figure 4A:
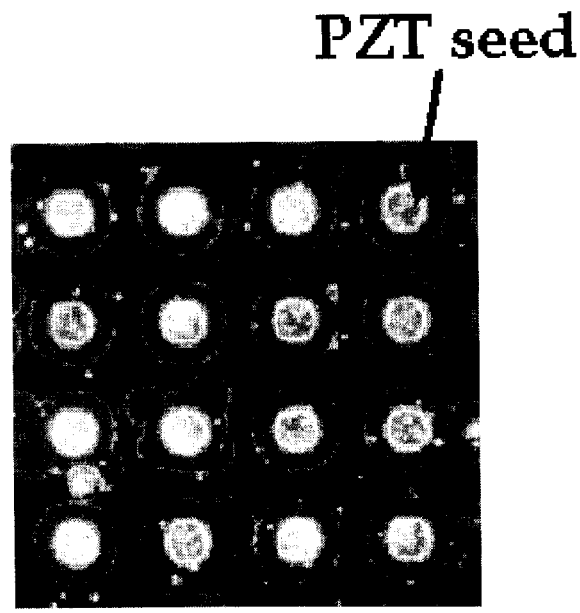
FIGS. 4A and 4B show optical micrographs illustrating single-grained growth results by selectively nucleated lateral crystallization (SNLC) of a ferroelectric thin film using a number of island-patterned PZT seeds according to an embodiment of the present invention, respectively.
Figure 4B:
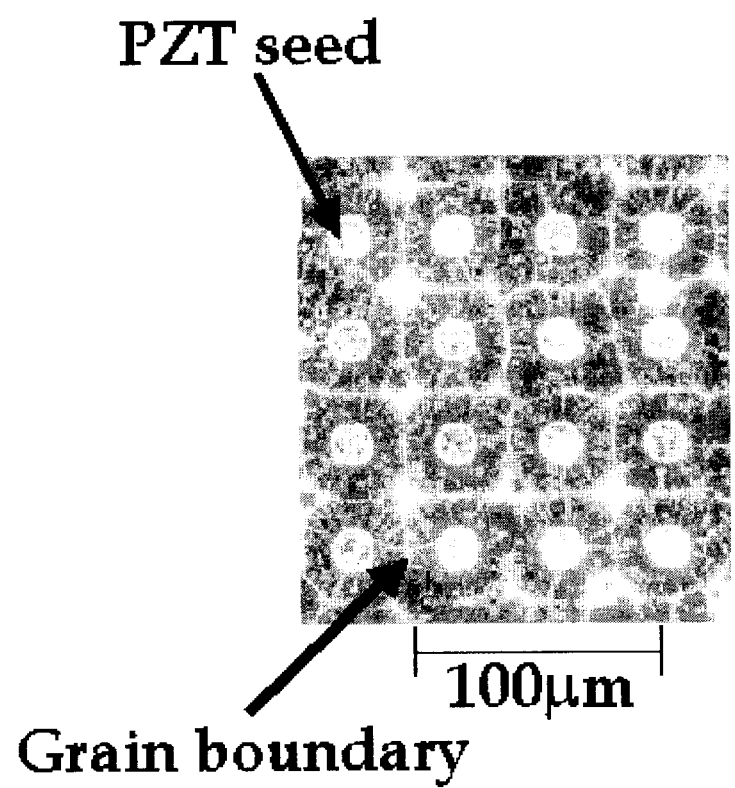

FIGS. 4A and 4B show optical micrographs illustrating single-grained growth results by selectively nucleated lateral crystallization (SNLC) of a ferroelectric thin film using a number of island-patterned PZT seeds according to an embodiment of the present invention, respectively.

In the specimen of FIGS. 4A and 4B, the selectively nucleated lateral crystallization (SNLC) method of the ferroelectric thin film using a number of single island patterned PZT seeds shown in FIGS. 3A and 3B is extended. That is, a PZT thin film is deposited on a Pt/SiO$_2$/Si substrate and then crystallized by the RTA, to change the Pyrochlore phase structure into the Perovskite phase structure. Then, the PZT thin film of the Perovskite phase is patterned to form a number of island patterned PZT seeds, and then the lateral crystallization has proceeded by the thermal annealing at the state where the PZT thin film has been deposited on the PZT seeds.

FIG. 4A is an optical microscopic picture when the PZT thin film has been thermally annealed for two hours at 560° C. In FIG. 4A, bright inner circles represent the PZT seeds formed in the lower portion of the specimen. From the start of the PZT seeds, the PZT thin film has been laterally transformed into the Perovskite structure. It can be seen that black colored Pyrochlore phases have remained around the portion changed into the Perovskite phase.

When the above resultant specimen is thermally annealed again for two hours at 600° C., the lateral growth proceeds as shown in FIG. 4B and meets the grain which grows laterally, to thereby complete the phase change in a chess board pattern in whole. The size of a single-grain having grown by the PZT seed of 14 μm×14 μm in size has been 40 μm×40 μm, and the laterally grown length has been 13 μm or so.

Figure 5:
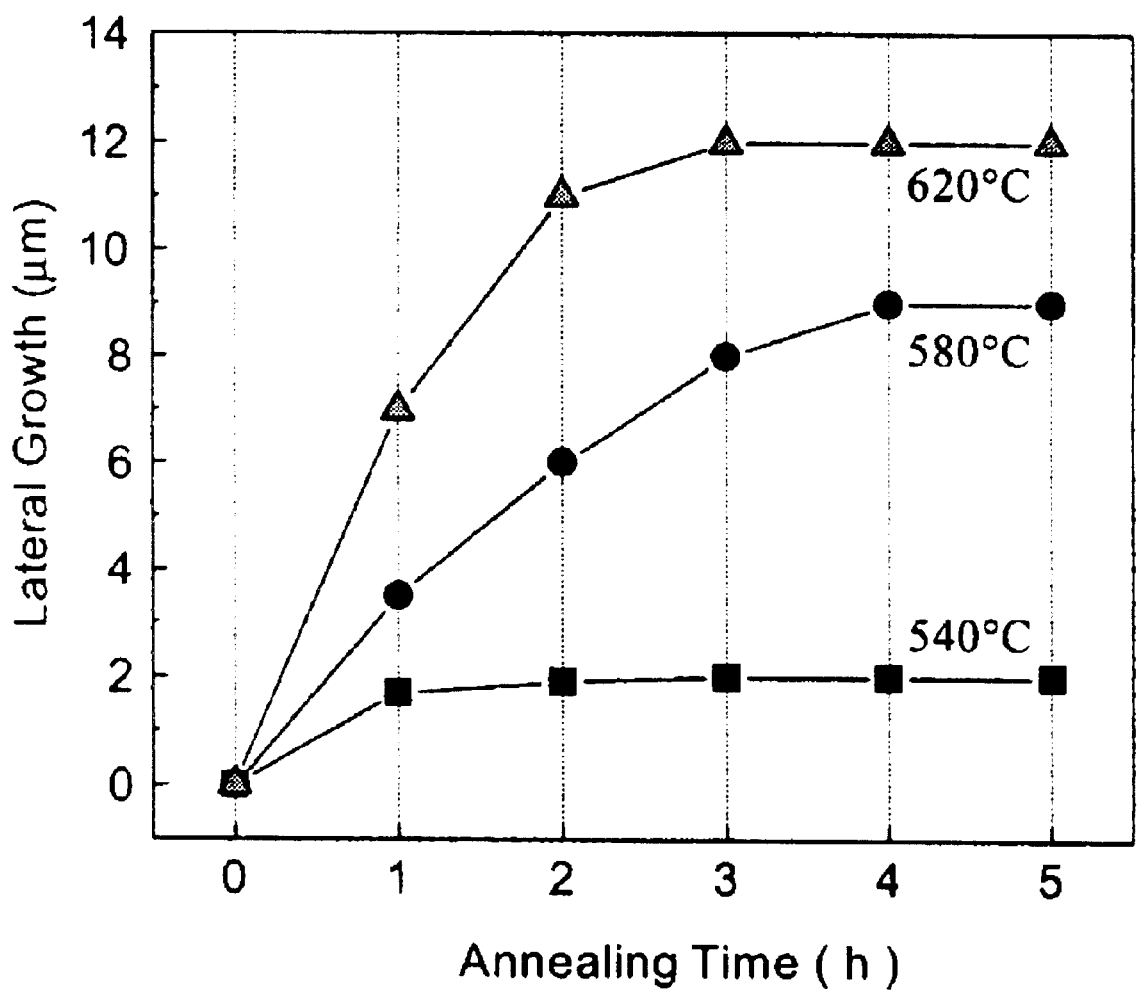
FIG. 5 is a graph illustrating growth lengths of a crystal depending upon temperatures at the time when a ferroelectric thin film using PZT seeds is crystallized according to an embodiment of the present invention.

Here, it has been observed that the laterally growing maximum size is determined depending upon the thermal annealing temperature, which is shown in FIG. 5. In the case that the specimen is thermally annealed at 540° C., the grain has laterally grown up to 2 μm within one hour and then has not grown any more even if a thermal annealing time becomes longer. The length has been saturated as 10 μm by four-hour thermal annealing at 580° C. and as 12 μm by three-hour thermal annealing at 620° C.

It has not been reported with respect to the phenomenon that the size of the grain is saturated depending upon the thermal annealing temperature. It is estimated that it has been impossible to observe the phenomenon of limiting the size of the grain since the size of the grain is determined depending upon the nucleation distribution and a nucleus is produced and grown again at a lateral portion during growth of the grain.

Also, the growth velocity of the grain is varied depending upon the thermal annealing temperature. It has been found that as the temperature increases, the growth velocity becomes faster. That is, the growth velocity is revealed as 2 μm/hour at 540° C., 3.5 μm/hour at 580° C., and 7 μm/hour at 620° C.

A method for fabricating a FRAM memory device having a one-transistor-one-ferroelectric thin film capacitor structure using the above single-grain formation technique will be described in detail with reference to FIGS. 6A through 6D.

Figure 6A:
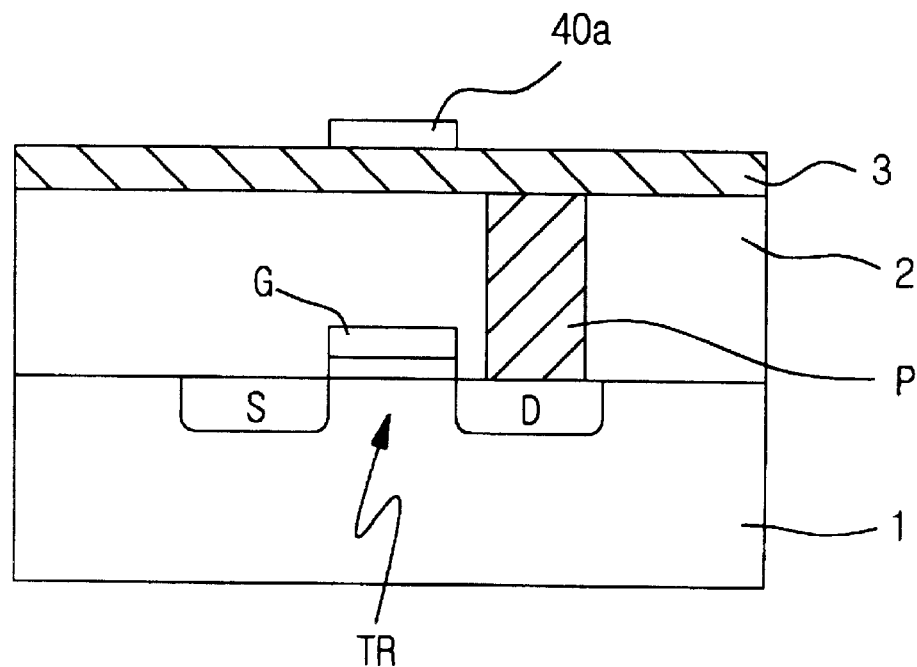
FIGS. 6A through 6D are cross-sectional views illustrating a ferroelectric thin film fabrication process according to an embodiment of the present invention.

First, as shown in FIG. 6A, a MOS transistor TR for controlling the operation of a ferroelectric thin film capacitor is formed on a silicon (Si) substrate 1 by the well-known method. Then, an insulation layer 2 made of a silicon-containing oxide or polymer group material is formed on the transistor, in order to insulate a transistor TR and a capacitor C. Then, a contact window with respect to the drain D of the MOS transistor TR is opened and the opened contact window is filled with a conductive material of metal or silicon group. By doing so, a plug P for mutually connecting between the transistor TR and a ferroelectric thin film capacitor C formed above the transistor TR is formed.

Since the process of forming a ferroelectric thin film from the lower electrode of the capacitor is accomplished in the same manner as that of the embodiment specimen described with reference to FIGS. 3A and 3B, the detailed description thereof will be omitted.

Thereafter, at least one selected from the group consisting of platinum (Pt), iridium (Ir), iridium oxide (IrO$_2$), ruthenium (Ru) and ruthenium oxide (RuO$_2$) as a lower electrode (that is, a first electrode) 3 of the capacitor, preferably, a platinum (Pt) thin film is deposited on the upper portion of the insulation layer 2 and the plug P in the thickness of about 2000 Å by a DC sputtering method in the same as that of the embodiment specimen.

On the lower electrode 3 is formed an artificial nucleation seed 40a at a position adjacent the plug P. It is preferable that the artificial nucleation seed 40a is made of a ferroelectric thin film. The ferroelectric thin film material is not particularly limited but a material used as a ferroelectric material of the ferroelectric thin film capacitor can be used.

As described above, for example, the PZT thin film is deposited on the nucleation seed 40a and then is crystallized by the RTA, to thereby change the Pyrochlore phase structure into the Perovskite phase structure. Then, the specimen is patterned to thereby form an island patterned PZT seed at an established position.

Figure 6B:
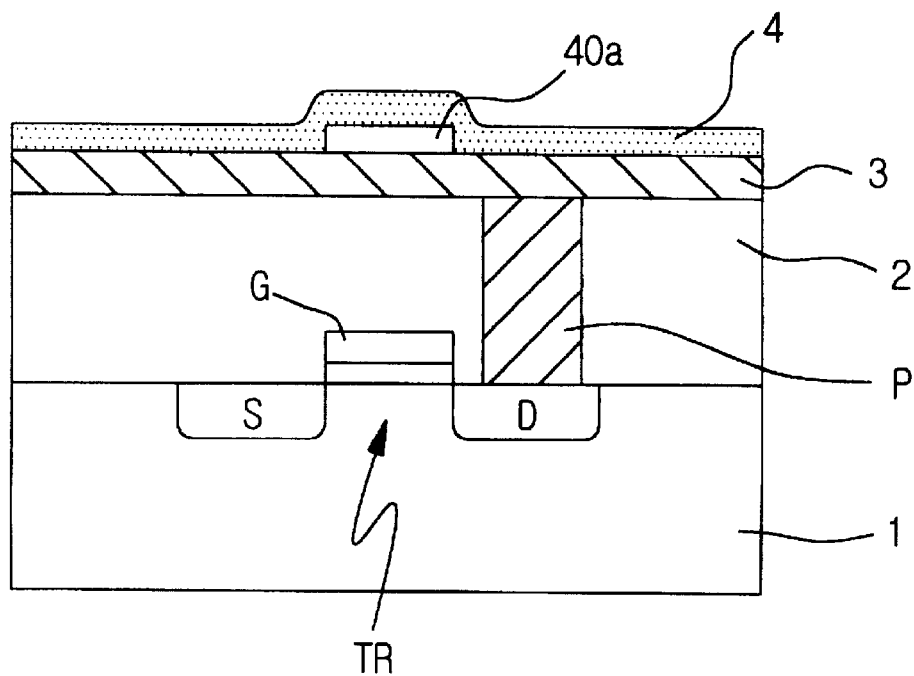

Then, as shown in FIG. 6B, the ferroelectric thin film 4 is deposited on the whole substrate including the nucleation seed 40a by one of a sol-gel method, a sputtering method and a metal-organic CVD method. In the case that a PZT thin film is used, it is preferable that a metal target such as Pb, Zr and Ti is used at 350° C. and the PZT thin film is deposited by a reaction sputtering method using oxygen and argon.

Figure 6C:
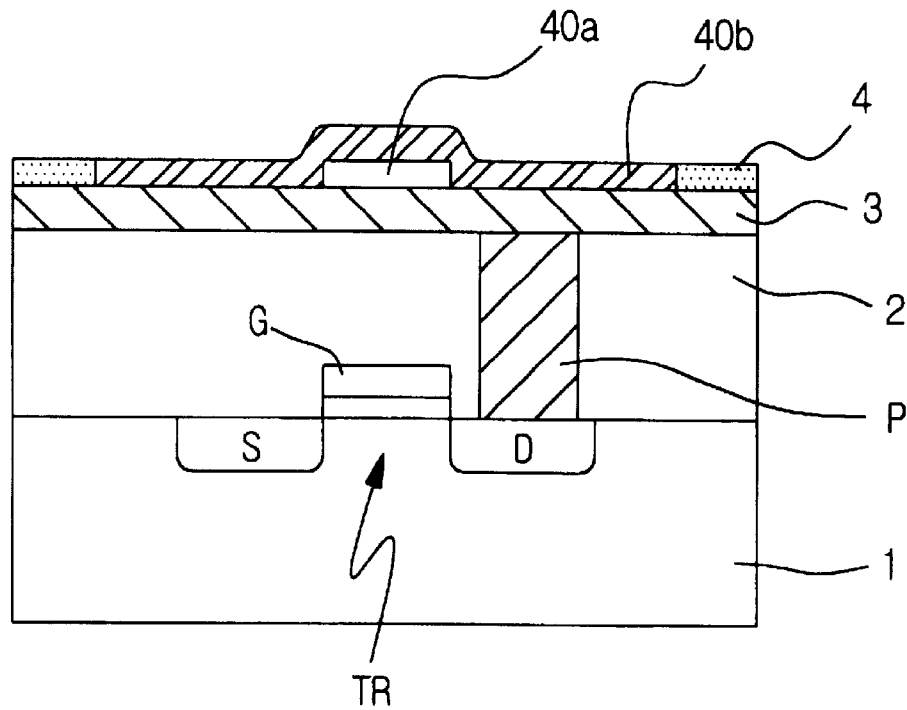

Then, as shown in FIG. 6C, a post-thermal annealing for crystallization of the ferroelectric thin film 4 is accomplished at 300~800° C. using one of a rapid thermal annealing (RTA) apparatus using a halogen lamp, a scanning type RTA apparatus and a tubular furnace.

In this case, the crystallization of the ferroelectric thin film 4 proceeds in the lateral direction from the upper portion of the nucleation seed 40a. The size of the laterally grown single-grained ferroelectric thin film 40b establishes the thermally annealing temperature and time by the length necessary for the capacitor in the memory device.

Figure 6D:
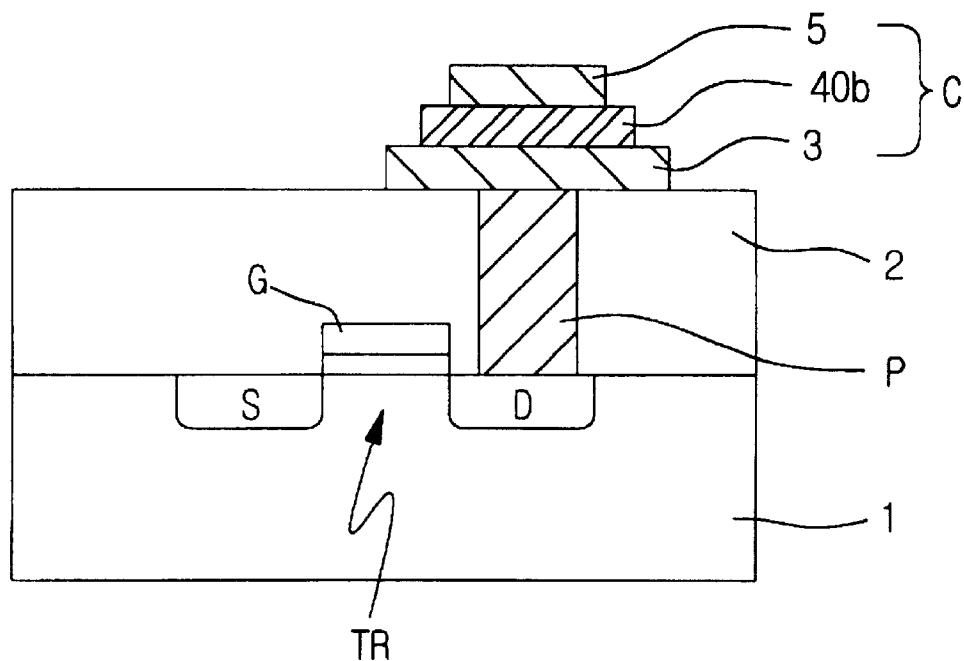

Thereafter, an upper electrode 5 used as a second electrode is formed on the upper portion of the laterally grown single-grained ferroelectric thin film, for example, using Pt and then patterned. Finally, a ferroelectric memory device structure is obtained as shown in FIG. 6D.

In the conventional case, the ferroelectric thin film can be formed in the thickness of 150–200 nm considering the ferroelectric thin film properties, but in the present invention case, the properties required for a FRAM which will be described below suffice even if the single-grained ferroelectric thin film is formed in the thickness of 50 nm. Thus, as the thickness of the ferroelectric thin film becomes thinner in the present invention, the memory device fabricated using the above ferroelectric thin film can be driven at a relatively low voltage in comparison with the conventional case.

The polarization of the PZT thin film has been measured using RT66A of Radiant Company which is used for testing polarization of the ferroelectric material. The leakage current of the thin film has been measured using HP4140B being minute current measuring equipment of HP company. The fatigue has been measured while changing the frequency from 1 kHz to 2 MHz using the above RT66A and a function generator.

Figure 7A:
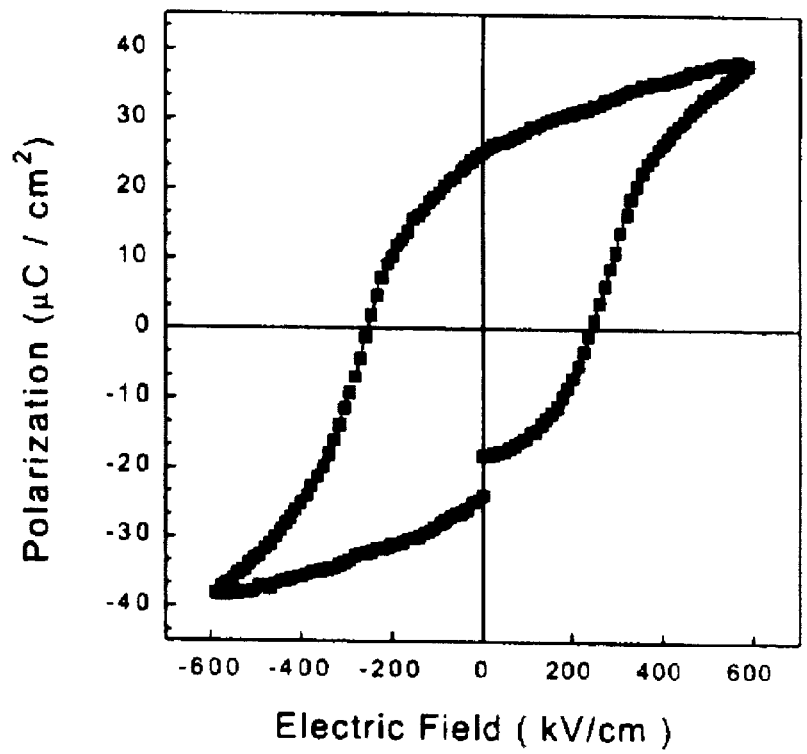
FIG. 7A is a graph illustrating polarization values depending upon an electric field as one of the electrical properties of a ferroelectric memory device fabricated according to an embodiment of the present invention.

As shown in FIG. 7A, a saturation polarization value measured at 10 V has been 42 $\mu C/cm^2$ and a remnant polarization value measured at 10 V has been 30 $\mu C/cm^2$.

Figure 7B:
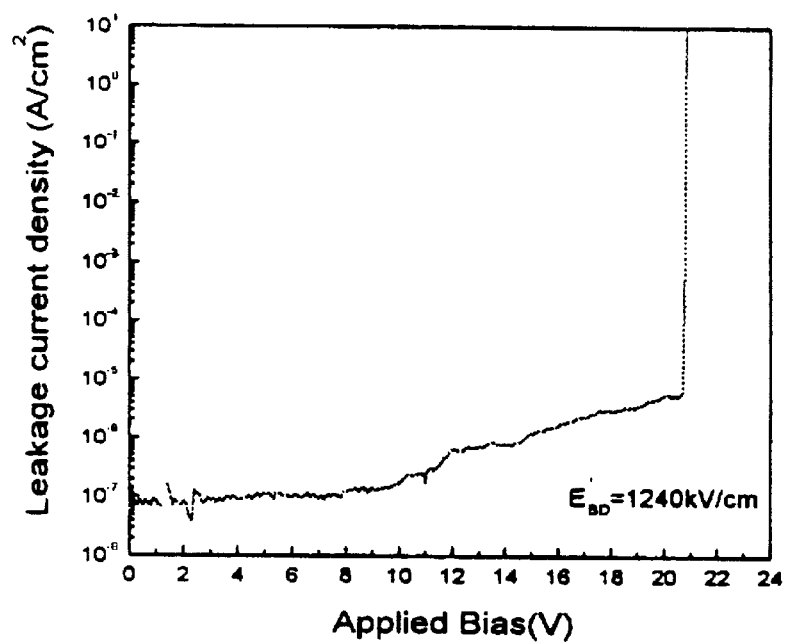
FIG. 7B is a graph illustrating leakage current measured with respect to voltage applied to an upper electrode as one of the electrical properties of a ferroelectric memory device fabricated according to an embodiment of the present invention.

The leakage current measured with respect to the voltage applied to an upper electrode 5 is shown in FIG. 7B. In the PZT thin film of 200 nm thick, the leakage current has been maintained $8 \times 10^{-8}$ $A/cm^2$ at the applied voltage of 8 V and a breakdown has been occurred at an electric field of 1240 kV/cm.

In contrast, in the case of the conventional polycrystalline PZT thin film in which an irregular nucleation and growth take place, the leakage current of $10^{-6} \sim 10^{-3} A/cm^2$ is revealed even under the low electric field of 200 kV/cm or so. As a result, it can be seen that the single-grained PZT thin film has a low leakage current density and a high insulation breakdown voltage. Accordingly, it can be seen that the present invention has achieved a remarkable property enhancement in comparison to the polycrystalline PZT thin film in view of an I-V characteristic.

Meanwhile, a fatigue phenomenon at the PZT thin film means that a remnant polarization value decreases according to repetition of reading and writing. In the case of the ferroelectric non-volatile RAM whose reading and writing operations both are relied upon the polarization value, the decrease in the remnant polarization value becomes an essential factor determining the life of the device. The decrease in the remnant polarization value causes a phenomenon that an identifying capability with respect to two logic states decreases. Finally, the two states are not identified, to thereby cause a malfunction of the device.

Figure 7C:
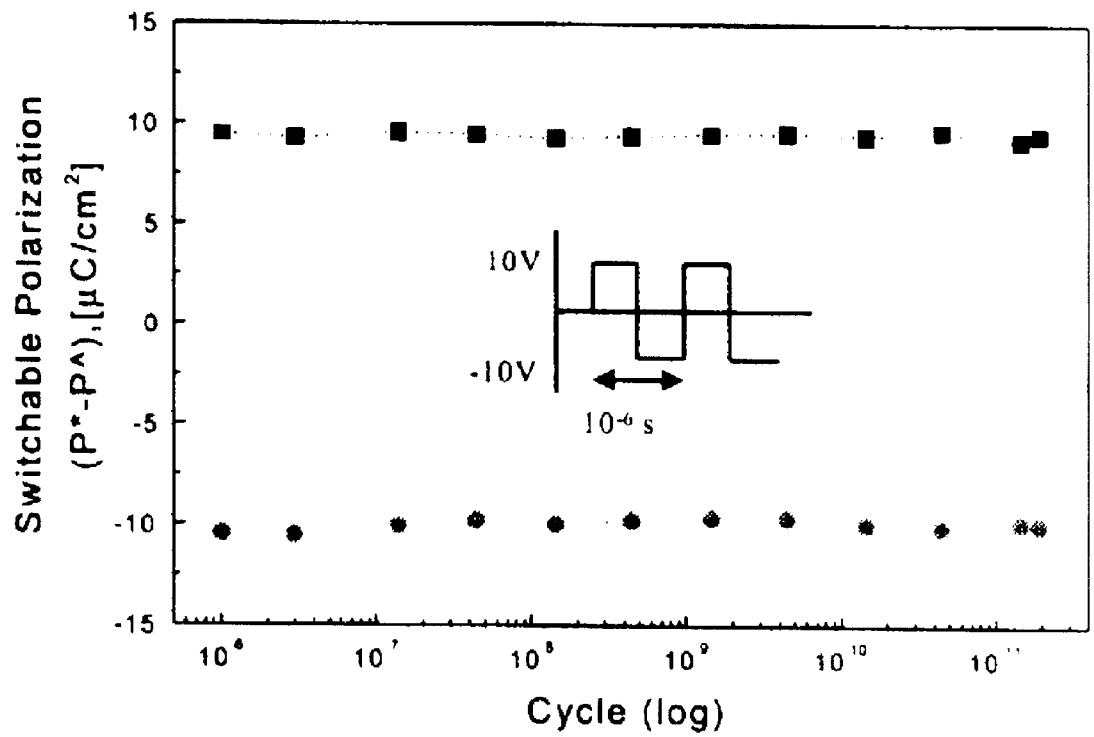
FIG. 7C is a graph illustrating fatigue test results in which a fatigue cycling has been performed with 1 MHz square wave form at ±10V, as one of the electrical properties of a ferroelectric memory device fabricated according to an embodiment of the present invention.

FIG. 7C illustrates fatigue test results in which a fatigue cycling has been performed with 1 MHz square wave form at ±10V. In FIG. 7C, the x-axis represents a logarithmic value by cycle and the y-axis represents a polarization at the 1 MHz frequency during a cycle of $2 \times 10^{11}$. In the case of the conventional polycrystalline PZT thin film using a Pt electrode, a remnant polarization value starts to decrease due to the fatigue from the $10^5 \sim 10^6$ cycle. In contrast, in the case of the present invention single-grained PZT thin film, it is revealed that there has been an excellent reliability having no property change during the $2 \times 10^{11}$ cycle.

The data retention among the aging phenomenon in the PZT thin film, means that a storage state declines as time passes after writing. The data retention is an essential property used as an actual non-volatile memory device. Excellent data retention is required for commercialization of a memory device.

Figure 8A:
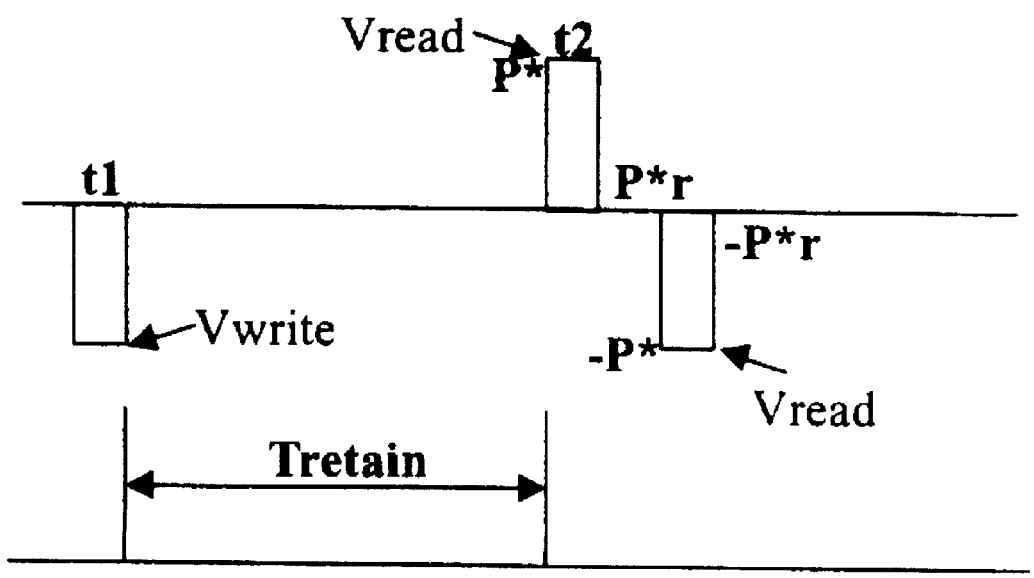
FIG. 8A is a graph illustrating pulses used in order to measure retention properties of a ferroelectric memory device fabricated according to an embodiment of the present invention.

FIG. 8A illustrates pulses used in order to measure data retention properties. In FIG. 8A, a writing voltage $V_{write}$ has been −10V and a reading voltage $V_{read}$ has been +10V. A pulse interval (t1) has been 8.6 $\mu$sec when a writing voltage has been applied, and a pulse interval (t2) has been 2 msec when a reading voltage has been applied. In the case of RT66A tester, four-time measured values have been stored after the retention time has elapsed at the time of measuring a data retention, which are shown as P*, P*r, −P*r and −P* in FIG. 8A.

Figure 8B:
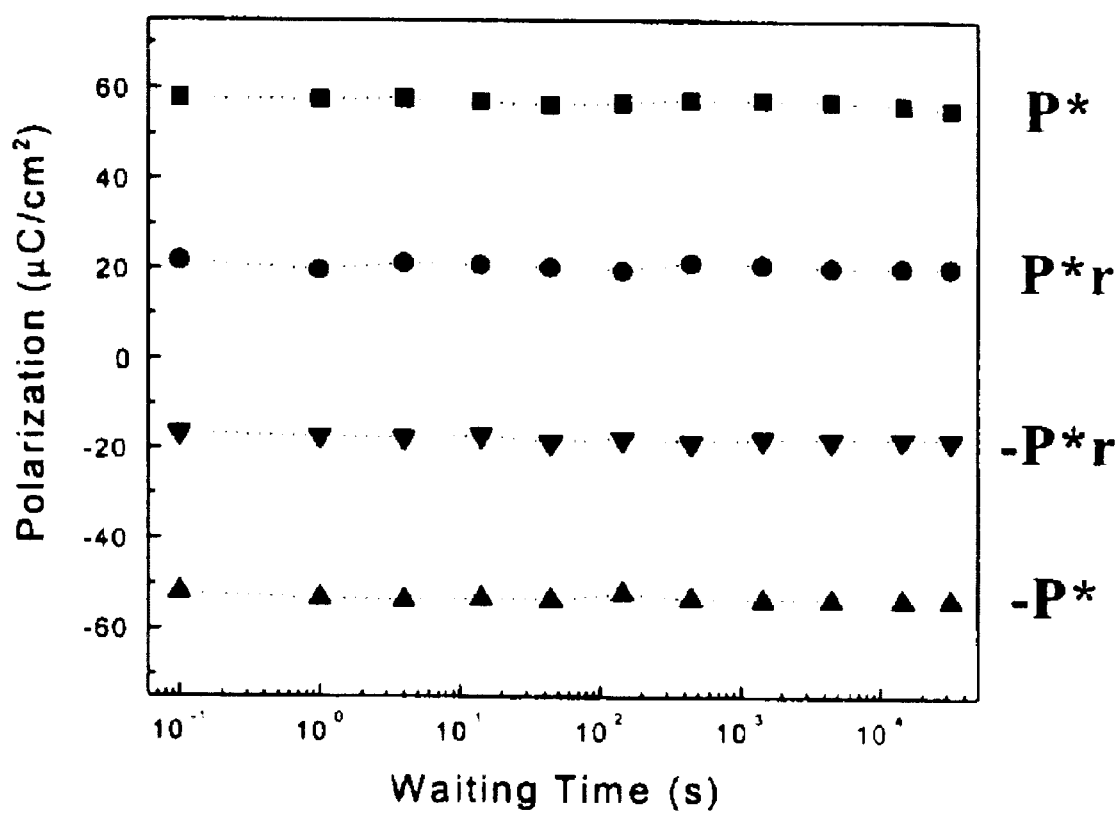
FIG. 8B is a graph illustrating retention measurement results of FIG. 8A.

FIG. 8B illustrates retention measurement results. In FIG. 8B, the x-axis represents a logarithmic value by time and the y-axis represents four polarization values of P*, P*r, −P*r and −P*. In the result of measuring retention at the state where a stored time has been maintained from one second to 30000 seconds after storing the data value at −10V, it could be seen that the initially stored data value has been maintained in the same value for 30000 seconds.

In the case of the conventional polycrystalline PZT thin film, the stored memory state decreases even at room temperature. Considering a stable reliability result is obtained and a breakdown phenomenon occurs at 20V or so, a writing voltage is 5V or so and a reading voltage is 5V or so in the case of an actual non-volatile memory, and the operating voltage becomes lower as integration of a device increases. Thus, the ferroelectric memory device using a single-grained PZT thin film according to the present invention is suitable in terms of leakage current, fatigue and retention characteristics, which have caused the existing PZT thin film is not suitable for the non-volatile memory device.

In view of the existing research result that all the characteristics such as dielectric, electrical, fatigue and retention characteristics are determined by a grain boundary where oxygen vacancies are dense at the grain boundary in the PZT thin film, the single-grained PZT thin film excluding the grain boundaries has revealed the single-grained PZT characteristic, because of the eliminated characteristic degeneration cause.

Also, all portions except for the portions functioning as capacitors in the PZT thin film deposited during fabrication of a FRAM device are etched as shown in FIG. 6D. Thus, since the nucleation seed used in the present invention are made of the PZT material and removed in an identical etching process, an additional etching process is unnecessary. Also, since the single-grained PZT thin film suffices all the electrical characteristics necessary for use in a non-volatile memory device, it is expected that the present invention will be greatly contributed for applicability of FRAM devices using the PZT thin film.

As described above, the present invention can obtain a large single-grained ferroelectric thin film grown by using a Perovskite phase nucleation seed, and a ferroelectric capacitor used for fabricating a ferroelectric memory device using the ferroelectric thin film. Also, the present invention can obtain a ferroelectric memory device fabricated by positioning an artificial nucleation seed for growing a single-grain ferroelectric at a lateral side of a portion connecting between a capacitor and a transistor and growing the nucleation seeds laterally. The ferroelectric memory device has remarkably enhanced dielectric, fatigue, electrical and aging characteristics in comparison to the existing polycrystalline ferroelectric memory device.

As described above, the present invention has been described according to preferred embodiments. However, the present invention is not limited to the particularly preferred embodiments. It is apparent to one skilled in the art that there are many various modifications and variations without departing off from the spirit or the technical scope of the appended claims.

What is claimed is:

1. A method for fabricating a single-grained ferroelectric thin film, the method comprising the steps of:

forming a first conductive layer on one side of a semiconductor substrate, by using a conductive material;

forming an artificial nucleation seed in an island form adjacent a position where a ferroelectric thin film is to be formed in the upper portion of the first conductive layer;

forming a ferroelectric thin film on the whole surface of the substrate including the nucleation seed; and thermally annealing the ferroelectric thin film to thereby grow the ferroelectric thin film positioned in the lateral side of the nucleation seed into a single-grained ferroelectric thin film.

2. The single-grained ferroelectric thin film fabrication method of claim 1, wherein the artificial nucleation seeds are made of a ferroelectric thin film.

3. The single-grained ferroelectric thin film fabrication method of claim 2, wherein the ferroelectric thin film is deposited by any one of a sol-gel method, a sputtering method and a metal-organic chemical vapor deposition method.

4. The single-grained ferroelectric thin film fabrication method of claim 2, wherein an annealing process for crystallization of the ferroelectric thin film is performed in the range of 300~800° C.

5. The single-grained ferroelectric thin film fabrication method of claim 4, wherein the size of the grain in the laterally grown single-grained thin film is determined by a thermal annealing temperature.

6. A method for fabricating a ferroelectric memory device using a ferroelectric thin film capacitor, the method comprising the steps of:

forming a transistor on one side of a semiconductor substrate;

forming an insulation layer on the upper portion of the transistor;

forming a plug for connecting the transistor and the capacitor via the insulation layer;

forming a first electrode layer used as a first electrode of the capacitor on the upper portion of the insulation layer and the plug;

forming an artificial nucleation seed at a position adjacent the plug on the upper portion of the first electrode;

forming a ferroelectric thin film on the whole surface of the substrate including the nucleation seed;

thermally annealing the ferroelectric thin film to thereby grow the ferroelectric thin film positioned in the lateral side of the nucleation seed into a single-grained ferroelectric thin film; and forming a second electrode layer used as a second electrode on the upper portion of the single-grained ferroelectric thin film.

7. The ferroelectric memory device fabrication method of claim 6, wherein a material used as the artificial nucleation seed is a ferroelectric thin film.

8. The ferroelectric memory device fabrication method of claim 6, wherein the artificial nucleation seed formation step comprises the sub-steps of:

forming a ferroelectric thin film on the upper portion of the first electrode layer;

thermally annealing the ferroelectric thin film, to thereby change a Pyrochlore structure into a Perovskite structure; and patterning the ferroelectric thin film of the Perovskite structure, to thereby form the island patterned nucleation seed at a position adjacent the plug.

9. The ferroelectric memory device fabrication method of claim 6, wherein the ferroelectric thin film is deposited by any one of a sol-gel method, a sputtering method and a metal-organic chemical vapor deposition method.

10. The ferroelectric memory device fabrication method of claim 6, wherein an annealing process for crystallization of the ferroelectric thin film is performed in the range of 300~800° C.

11. The ferroelectric memory device fabrication method of claim 10, wherein the crystallization thermal annealing uses one of a tubular furnace, a rapid thermal annealing (RTA) apparatus, and as canning type rapid thermal annealing apparatus.

12. The ferroelectric memory device fabrication method of claim 6, wherein the size of the grain of the laterally grown single-grain thin film sets a thermal annealing temperature and time by a length necessary for the capacitor in the memory device.

13. The ferroelectric memory device fabrication method of claim 6, wherein the ferroelectric thin film is made of a ferroelectric material of $ABO_3$ perovskite composite, in which A is made of at least one selected from the group consisting of lead (Pb), barium (Ba), and strontium (Sr), and B is made of at least one selected from the group consisting of zirconium (Zr), titanium (Ti), lanthanum (La), and tungsten (W).

14. The ferroelectric memory device fabrication method of claim 6, wherein the ferroelectric thin film is made of $A'Bi_bM_cO_{(2+3b+5c)/2}$ type composite including Bi, in which A' is made of at least one selected from the group consisting of barium (Ba), strontium (Sr), and lead (Pb) and M is made of at least one selected from the group consisting of titanium (Ti), tantalum (Ta), and niobium (Nb).

15. The ferroelectric memory device fabrication method of claim 6, wherein the ferroelectric thin film is made of a ferroelectric material of $Bi_{4-x}La_xTi_3O_{12}$ (x=0~4).

16. The ferroelectric memory device fabrication method of claim 6, wherein the electrode layer is made of at least one selected from the group consisting of platinum (Pt), iridium (Ir), iridium oxide ($IrO_2$), ruthenium (Ru) and ruthenium oxide ($RuO_2$).

17. The ferroelectric memory device fabrication method of claim 6, wherein the plug is made of metal or a silicon-containing material.

18. The ferroelectric memory device fabrication method of claim 6, wherein the insulation layer is made of a silicon-containing oxide or a polymer group material.

19. A method for fabricating a ferroelectric thin film capacitor, the method comprising the steps of:

forming an insulation layer on one side of a semiconductor substrate;

forming a first electrode layer used as a first electrode of the capacitor on the upper portion of the insulation layer;

forming island patterned an artificial nucleation seed on the upper portion of the first electrode adjacent a position where a capacitor is formed;

forming a ferroelectric thin film on the whole surface of the substrate including the nucleation seed;

thermally annealing the ferroelectric thin film to thereby grow the ferroelectric thin film positioned in the lateral side of the nucleation seed into a single-grained ferroelectric thin film; and forming a second electrode layer used as a second electrode on the upper portion of the single-grained ferroelectric thin film.

* * * * *